(12) United States Patent
Yang et al.

(10) Patent No.: US 8,779,491 B2
(45) Date of Patent: *Jul. 15, 2014

(54) 3D VIA CAPACITOR WITH A FLOATING CONDUCTIVE PLATE FOR IMPROVED RELIABILITY

(71) Applicant: International Business Machines Corporation, Armonk, NY (US)

(72) Inventors: Chih-Chao Yang, Glenmont, NY (US); Fen Chen, Williston, VT (US); Baozhen Li, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/772,493

(22) Filed: Feb. 21, 2013

(65) Prior Publication Data

US 2013/0161791 A1    Jun. 27, 2013

Related U.S. Application Data

(63) Continuation of application No. 12/898,340, filed on Oct. 5, 2010, now Pat. No. 8,405,135.

(51) Int. Cl.
*H01L 27/108*    (2006.01)

(52) U.S. Cl.
USPC ............ 257/301; 257/532; 438/243; 438/244

(58) Field of Classification Search
CPC ......... H01L 28/40; H01L 28/56; H01L 28/57; H01L 28/60; H01L 28/65; H01L 28/75; H01L 28/87; H01L 28/91; H01L 28/92

USPC .................. 257/301, 532, E27.048, E21.008, 257/E27.092, E29.346, E21.396; 438/239, 438/243, 244, 253, 381, 386, 387

See application file for complete search history.

(56) References Cited

U.S. PATENT DOCUMENTS

| 5,055,966 | A | 10/1991 | Smith et al. |
| 5,675,184 | A | 10/1997 | Matsubayashi et al. |
| 5,879,985 | A | 3/1999 | Gambino et al. |

(Continued)

OTHER PUBLICATIONS

International Publication No. PCT/EP2011/064079 Filing Date: Aug. 16, 2011 International Search Report and Written Opinion.

(Continued)

*Primary Examiner* — Khiem D Nguyen
(74) *Attorney, Agent, or Firm* — Catherine Ivers; Parashos Kalaitzis; Kevin Anderson

(57) ABSTRACT

The present invention provides a 3D via capacitor and a method for forming the same. The capacitor includes an insulating layer on a substrate. The insulating layer has a via having sidewalls and a bottom. A first electrode overlies the sidewalls and at least a portion of the bottom of the via. A first high-k dielectric material layer overlies the first electrode. A first conductive plate is over the first high-k dielectric material layer. A second high-k dielectric material layer overlies the first conductive plate and leaves a remaining portion of the via unfilled. A second electrode is formed in the remaining portion of the via. The first conductive plate is substantially parallel to the first electrode and is not in contact with the first and second electrodes. An array of such 3D via capacitors is also provided.

14 Claims, 16 Drawing Sheets

(56) References Cited

U.S. PATENT DOCUMENTS

| | | |
|---|---|---|
| 6,153,901 A | 11/2000 | Higashi |
| 6,261,895 B1 * | 7/2001 | Adkisson et al. ............. 438/240 |
| 6,461,914 B1 | 10/2002 | Roberts et al. |
| 6,670,237 B1 | 12/2003 | Loh et al. |
| 6,764,915 B2 | 7/2004 | Lee |
| 6,963,483 B2 | 11/2005 | Chakravorty et al. |
| 7,115,970 B2 | 10/2006 | Gilgen et al. |
| 8,405,135 B2 * | 3/2013 | Yang et al. ..................... 257/301 |
| 2002/0079531 A1 * | 6/2002 | Al-Shareef et al. ........... 257/306 |
| 2004/0056324 A1 | 3/2004 | Ning et al. |
| 2006/0019483 A1 * | 1/2006 | Barth et al. ................... 438/618 |
| 2007/0032062 A1 | 2/2007 | Lee et al. |
| 2007/0152258 A1 * | 7/2007 | Kim .............................. 257/309 |
| 2008/0157276 A1 | 7/2008 | Park |

OTHER PUBLICATIONS

Application No. PCT/EP2011/064079 Filed: Aug. 16, 2011 Partial International Search Report.

* cited by examiner

3D VIA CAPACITOR WITH A FLOATING CONDUCTIVE PLATE FOR IMPROVED RELIABILITY

CROSS-REFERENCE TO RELATED APPLICATION

This application is related to and a continuation of U.S. application Ser. No. 12/898,340 filed on Oct. 5, 2010, issued as U.S. Pat. No. 8,405,135, the entire contents of which are incorporated herein by reference.

FIELD OF THE INVENTION

This invention relates generally to semiconductor devices and more particularly to a three-dimensional (3D) via capacitor with a floating conductive plate and an array of such 3D via capacitors for use in semiconductor devices, such as semiconductor memory devices and the like.

BACKGROUND OF THE INVENTION

A capacitor is a basic electrical component of semiconductor devices such as semiconductor memory devices. A semiconductor memory device generally comprises a plurality of memory cells which are used to store a large quantity of information. Each memory cell includes a capacitor for storing electric charge and a corresponding field effect transistor for opening and closing charge and discharging passages of the capacitor. As the size of semiconductor devices continues to shrink, there is a desire to decrease the area occupied by each component of a semiconductor device. Capacitors are one component that can occupy considerable area on a semiconductor die depending on the size of the capacitor and/or the number of capacitors on the die.

One example of capacitors is a metal-insulator-metal (MIM) capacitor. MIM capacitors are typically made by forming a first metal plate on a substrate, forming a layer of dielectric material over the first metal plate and then forming a second metal plate over the layer of dielectric material. A traditional MIM capacitor is two-dimensional (2D), i.e., the two facing metal plates are planar and substantially parallel to each other and to the substrate. The capacitance of a MIM capacitor is a function of the surface area of the two facing metal plates and other parameters such as the dielectric constant of the dielectric material and the spacing between the two plates. Thus, one primary means to increase the capacitance of a MIM capacitor is to increase the sizes of the metal plates. However, this will consume more surface area of the substrate. Accordingly, a need exists to reduce the surface area on the substrate occupied by a capacitor without sacrificing its capacitance.

In addition, a capacitor is required to operate at high voltages for some applications, such as a decoupling capacitor in power amplifiers and microelectromechanical systems (MEMS). The reliability of a traditional capacitor will be significantly reduced under high operating voltages. Accordingly, there is a need to fabricate a capacitor with improved reliability as well.

SUMMARY OF THE INVENTION

The present invention provides a three-dimensional (3D) via capacitor having reduced substrate space requirement and improved reliability over conventional MIM capacitors mentioned above. This invention also provides a method for forming such a capacitor.

In accordance with one embodiment, the present invention provides a capacitor including: an insulating layer on a substrate, the insulating layer including a via having sidewalls and a bottom; a first electrode overlying the sidewalls and at least a portion of the bottom of the via; a first high-k dielectric material layer overlying the first electrode; a first conductive plate over the first high-k dielectric material layer; a second high-k dielectric material layer formed to overlie the first conductive plate and to leave a remaining portion of the via unfilled; and a second electrode formed in the remaining portion of the via, wherein the first conductive plate is substantially parallel to the first electrode and is not in contact with the first and second electrodes.

In accordance with another embodiment, the present invention provides an array of capacitors including a second chip having a second capacitor bonded atop a first chip having a first capacitor. The first and the second capacitors have substantially the same structure. Each of the first and the second capacitors includes: an insulating layer on a substrate, the insulating layer including a via having sidewalls and a bottom; a first electrode overlying the sidewalls and at least a portion of the bottom of the via; a first high-k dielectric material layer overlying the first electrode; a first conductive plate over the first high-k dielectric material layer; a second high-k dielectric material layer formed to overlie the first conductive plate and to leave a remaining portion of the via unfilled; and a second electrode formed in the remaining portion of the via, wherein the first conductive plate is substantially parallel to the first electrode and is not in contact with the first and second electrodes; a lower interconnect level between the substrate and the insulating layer, the lower interconnect level including a first dielectric layer having a first conductive feature embedded therein; and an upper interconnect level above the insulating layer, the upper interconnect level including a second dielectric layer having a second conductive feature embedded therein, wherein the first electrode is in contact with the second conductive feature and the second electrode is in contact with the first conductive feature. The first conductive feature of the second capacitor is in contact with the second conductive feature of the first capacitor, and the second conductive feature of the second capacitor is connected to the first conductive feature of the first capacitor through a conductor.

In accordance with a still another embodiment, the present invention provides a method of forming a capacitor including the steps of: providing an initial structure that includes a substrate having a lower interconnect level including a first dielectric layer having a first conductive feature embedded therein, a first dielectric capping layer on the lower interconnect level, an insulating layer on the first dielectric capping layer, and a patterned hardmask layer having a top surface on the insulating layer, wherein the insulating layer has a via that extends partially through the first dielectric capping layer, the via having sidewalls and a bottom; forming a first electrode layer over the sidewalls and the bottom of the via and the top surface of the hardmask layer; forming a first high-k dielectric material layer over the first electrode layer; forming a first conductive plate layer over the first high-k dielectric material layer; forming a via gouging at the bottom of the via by removing a portion of the first conductive plate layer, a portion of the first high-k dielectric material layer, a portion of the first electrode layer, a portion of the first dielectric capping layer and a portion of the first conductive feature, the via gouging having sidewalls and a bottom and extending partially through the first conductive feature; forming a second high-k dielectric material layer over the first conductive plate layer and over the sidewalls and the bottom of the via gouging; selectively removing the second high-k dielectric material layer at the bottom and lower sidewalls of the via gouging; filling the via and the via gouging with a second electrode material; partially removing the second electrode material to form a recess at the top of the via; forming a second dielectric capping layer in the recess; and forming an upper interconnect level including a second dielectric layer having a second conductive feature embedded therein over the insulating layer, wherein second conductive feature is in contact with the first conductive plate layer.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

Figure 1:
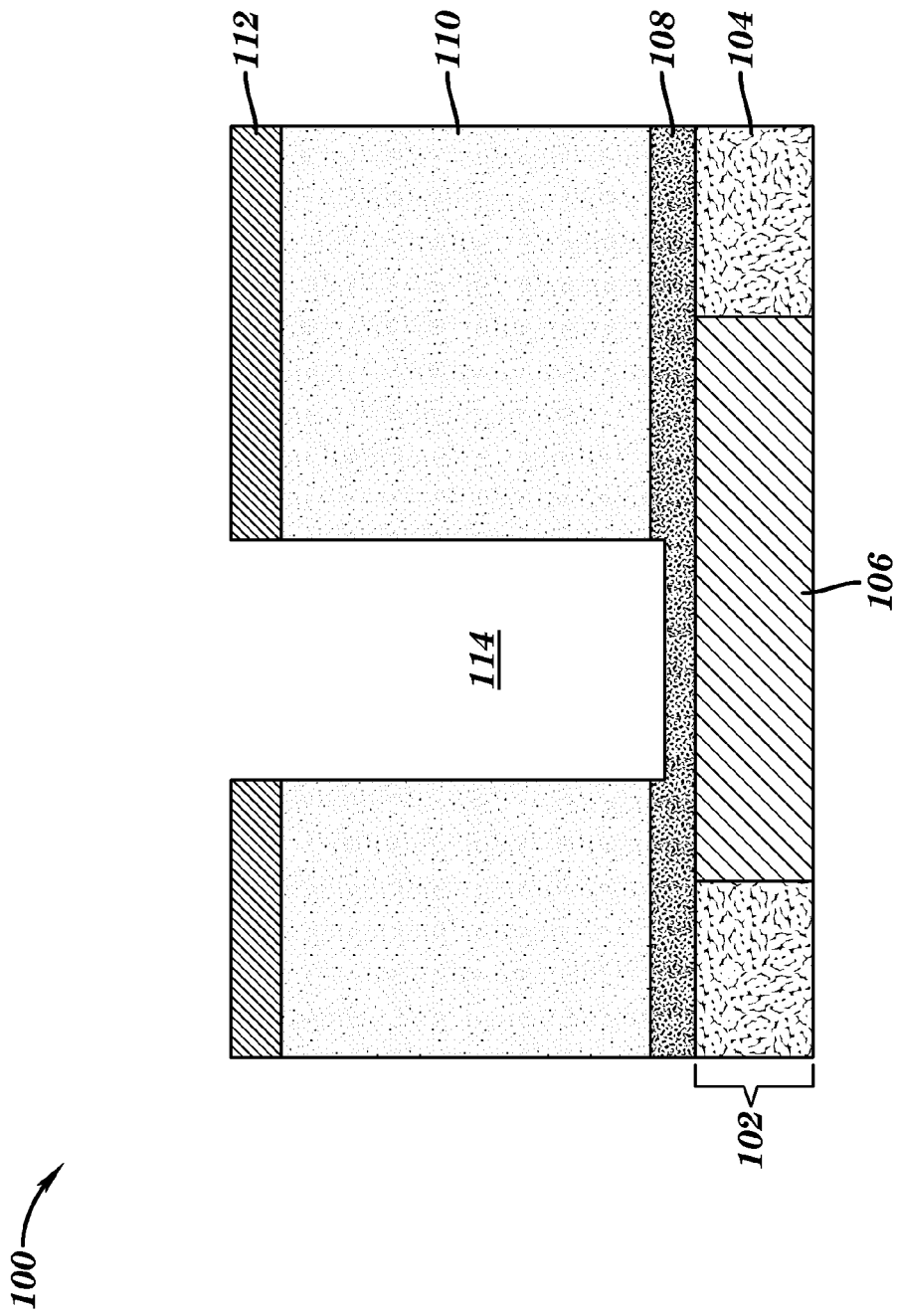
FIGS. 1-11 are cross-sectional views of a 3D via capacitor with a floating conductive plate at various processing stages, in accordance with embodiments of the present invention.

It will be appreciated that for simplicity and clarity of illustration, elements shown in the drawings have not necessarily been drawn to scale. For example, the dimensions of some of the elements may be exaggerated relative to other elements for purpose of clarity.

DETAILED DESCRIPTION OF PREFERRED EMBODIMENTS

The present invention will now be described more fully hereinafter with reference to the accompanying drawings in which preferred embodiments of the invention are shown. This invention may, however, be embodied in many different forms and should not be construed as limited to the illustrated embodiments set forth herein. Rather, these embodiments are provided so that this disclosure will be thorough and complete, and will fully convey the scope of the invention to those skilled in the art. Like numerals refer to like features throughout.

It will be understood that when an element, such as a layer, is referred to as being "on" or "over" another element, it can be directly on the other element or intervening elements may also be present. In contrast, when an element is referred to as being "directly on" or "directly over" another element, there are no intervening elements present.

The present invention provides a three-dimensional (3D) via capacitor having at least one floating conductive plate suspended between the two electrodes. The term "3D" refers to the fact that at least one portion of the two electrodes of the via capacitor is substantially vertical to the substrate upon which the capacitor is built. This vertical structure leads to reduced substrate space requirement over conventional MIM capacitors. The at least one floating conductive plate is substantially parallel to at least one of the two electrodes. Due to the existence of the at least one floating conductive plate, the inventive capacitor has improved reliability over the conventional MIM capacitors mentioned above. The present invention also provides an array of such 3D via capacitors with further improved reliability.

In one embodiment, the capacitor of the present invention includes an insulating layer on a substrate, the insulating layer including a via having sidewalls and a bottom; a first electrode overlying the sidewalls and at least a portion of the bottom of the via; a high-k dielectric material layer formed to overlie the first electrode and to leave a remaining portion of the via unfilled; a second electrode formed in the remaining portion of the via; and a first conductive plate embedded in the high-k dielectric material layer. The first conductive plate is substantially parallel to the first electrode and is not in contact with the first and second electrodes.

Referring to FIG. 1, a structure 100 is provided. The structure 100 includes a lower interconnect level 102, an insulating layer 110 over the lower interconnect level 102, and a patterned hardmask layer 112 over the insulating layer 110. The lower interconnect level 102 may be located above a semiconductor substrate (not shown) including one or more semiconductor devices. The lower interconnect level 102 includes a dielectric layer 104 and a conductive feature 106 embedded in the dielectric layer 104. Preferably, the lower interconnect level 102 further includes a diffusion barrier layer (not shown) which separates the conductive feature 106 from the dielectric layer 104.

The insulating layer 110 of FIG. 1 has a via 114 located therein. The via 114 is above the first conductive feature 106. Preferably, the initial structure 100 has a dielectric capping layer 108 located between the lower interconnect level 102 and the insulating layer 110. In this case, the via 114 extends partially through the dielectric capping layer 108 and exposes a portion of the dielectric capping layer 108 which is located directly above the first conductive feature 106. The via 114 may have a shape of a cylinder, a cube, or a cuboid.

The patterned hard mask 112 is used as an etch mask to form the via 114 in the insulating layer 110. Although the structure shown in FIG. 1 illustrates a single via 114, the present invention contemplates forming any number of such vias in the insulating layer 110.

The structure 100 may be made by conventional techniques well known to those skilled in the art. For example, the structure 100 can be formed by first applying the dielectric layer 104 to a surface of a substrate (not shown). The substrate may be a semiconducting material, an insulating material, a conducting material or a combination of two or more of the foregoing materials. When the substrate is comprised of a semiconducting material, a semiconductor material such as Si, SiGe, SiGeC, SiC, Ge alloys, GaAs, InAs, InP or other group III/V or II/VI semiconductor materials may be used. In addition to these listed types of semiconducting materials, the present invention also contemplates cases in which the substrate is a layered semiconductor such as, for example, Si/SiGe, Si/SiC, silicon-on-insulators (SOIs) or silicon germanium-on-insulators (SGOIs). When the substrate is a semiconducting material, one or more semiconductor devices such as, for example, complementary metal oxide semiconductor (CMOS) devices may be fabricated thereon.

When the substrate is an insulating material, the insulating material can be an organic insulator, an inorganic insulator or a combination of an organic insulator and an inorganic insulator. The substrate can be either single layer or multilayers.

When the substrate is a conducting material, the substrate may include, for example, polysilicon, an elemental metal, an alloy of elemental metals, a metal silicide, a metal nitride or a combination of two or more of the foregoing materials. The substrate can be either single layer or multilayers.

The dielectric layer 104 of the lower interconnect level 102 may be any interlevel or intralevel dielectrics including inorganic dielectrics or organic dielectrics. The dielectric layer 104 may be porous or non-porous. Examples of suitable dielectrics that can be used as the dielectric layer 104 include, but are not limited to, $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or substituted aryl moieties which are linked together by bonds, fused rings, or inert linking groups such as, for example, oxygen, sulfur, sulfone, sulfoxide, carbonyl and the like.

Preferably, the dielectric layer 104 has a dielectric constant of about 4.0 or less. More preferably, the dielectric layer 104 has a dielectric constant of about 2.8 or less. These dielectrics generally have a lower parasitic crosstalk as compared with dielectric materials that have a dielectric constant higher than 4.0. The dielectric constants mentioned herein are measured in a vacuum.

The thickness of the dielectric layer 104 may vary depending on the dielectric material used as well as the exact number of dielectric layers within the lower interconnect level 102. Typically, and for normal interconnect structures, the dielectric layer 104 has a thickness from about 200 nm to about 450 nm.

The conductive feature 106 of the lower interconnect level 102 may be formed by lithography. For example, a photoresist layer is applied to the surface of the dielectric layer 104. The photoresist layer is exposed to a desired pattern of radiation. The exposed photoresist layer is developed utilizing a conventional resist developer. The patterned photoresist layer is used as an etch mask to transfer the pattern into the dielectric layer 104. The etched region of the dielectric layer 104 is then filled with conductive material to form the conductive feature 106.

The conductive feature 106 may be formed from materials including, but are not limited to, polysilicon, a conductive metal, an alloy of two or more conductive metals, a conductive metal silicide and a combination of two or more of the foregoing materials. Preferably, the conductive feature 106 is a conductive metal such as Cu, W, Al, Ti, Ta, Au, or alloys of the foregoing metals. More preferably, the conductive feature 106 is Cu or a Cu alloy (such as AlCu). The conductive feature 106 is filled into the etched region of the dielectric layer 104 using a conventional deposition process including, but not limited to, chemical vapor deposition (CVD), plasma enhanced chemical vapor deposition (PECVD), sputtering, chemical solution deposition or plating. After deposition, a conventional planarization process such as, for example, chemical mechanical polishing (CMP) can be used to provide a structure in which the conductive feature 106 has an upper surface that is substantially coplanar with the upper surface of the dielectric layer 104.

The conductive feature 106 is preferably separated from the dielectric layer 104 by a diffusion barrier layer (not shown). The diffusion barrier layer may include, but is not limited to, Ta, TaN, Ti, TiN, Ru, RuTaN, RuTa, W, WN or any other material that can serve as a barrier to prevent a conductive material from diffusing into a dielectric material layer. The diffusion barrier layer may be formed by a deposition process such as, for example, atomic layer deposition (ALD), CVD, PECVD, physical vapor deposition (PVD), sputtering, chemical solution deposition, or plating. The diffusion barrier layer may also include a bilayer structure that includes a lower layer of a metallic nitride such as, for example, TaN and an upper metallic layer such as, for example, Ta.

After forming the conductive feature 106 in the dielectric layer 104, a dielectric capping layer 108 is formed on the surface of the lower interconnect level 102. The dielectric capping layer 108 is formed by a conventional deposition process such as, for example, CVD, PECVD, chemical solution deposition, or evaporation. The dielectric capping layer 108 may be any suitable dielectric capping material including, but not limited to, SiC, $Si_4NH_3$, $SiO_2$, a carbon doped oxide, a nitrogen and hydrogen doped silicon carbide (SiC (N,H)), or multilayers thereof. The thickness of the dielectric capping layer 108 may vary depending on the exact means of the deposition process as well as the material employed. Typically, the dielectric capping layer 108 has a thickness from about 15 nm to about 55 nm, with a thickness from about 25 nm to about 45 nm being more typical.

Next, the insulating layer 110 is formed on the upper exposed surface of the dielectric capping layer 108. The insulating layer 110 may be the same or a different dielectric material as that of the dielectric layer 104. Preferably the insulating layer 110 is the same dielectric material as that of the first dielectric layer 104. Examples of suitable dielectrics that can be used as the insulating layer 110 include, but are not limited to, $SiO_2$, silsesquioxanes, C doped oxides (i.e., organosilicates) that include atoms of Si, C, O and H, thermosetting polyarylene ethers, or multilayers thereof. Preferably, the insulating layer 110 has a dielectric constant of about 4.0 or less. More preferably, the insulating layer 110 has a dielectric constant of about 2.8 or less. The processing techniques and thickness ranges for the dielectric layer 104 are also applicable here for the insulating layer 110.

The insulating layer 110 can also comprise two different materials, i.e., deposition of one dielectric material first, followed by deposition of a different dielectric material. In one embodiment of the present invention, the insulating layer 110 comprises two different low k dielectric materials, such as a porous low k dielectric material and a dense (or non-porous) low k dielectric material. In such an embodiment, the porous low k dielectric has a dielectric constant of about 2.8 or less, and the dense porous low k dielectric has a dielectric constant of about 4.0 or less.

Next, the via 114 is formed into the insulating layer 110 by first forming a patterned hardmask layer 112 atop the upper surface of the insulating layer 110. The hardmask layer 112 includes an oxide, nitride, oxynitride, or a combination of two or more of the foregoing materials. The hardmask layer 112 may have a single layer or multilayer structure. Preferably, the hardmask layer 112 is an oxide such as $SiO_2$ or a nitride such as $Si_3N_4$. The hardmask layer 112 is formed utilizing a conventional deposition process such as, for example, CVD, PECVD, chemical solution deposition or evaporation. The thickness of the as-deposited hardmask layer 112 may vary depending upon the type of hardmask material formed, the number of layers that make up the hardmask layer 112 and the deposition technique used in forming the same. Typically, the as-deposited hardmask layer 112 has a thickness from about 10 nm to about 80 nm, with a thickness from about 20 nm to about 60 nm being more typical.

The hardmask layer 112 is patterned by a lithographic process. A photoresist (not shown) is formed atop the hardmask layer 112 by a conventional deposition process such as, for example, spin-on coating or chemical solution deposition. The photoresist may be a positive-tone or a negative-tone photoresist. The photoresist is then subjected to a lithographic process which includes exposing the photoresist to a pattern of radiation and developing the exposed resist utilizing a conventional resist developer. The lithographic step provides a patterned photoresist atop the hardmask layer 112 that defines the width of the via 114. The via pattern is transferred into the hardmask layer 112 and then subsequently into the insulating layer 110 and the dielectric capping layer 108 utilizing one or more etching processes.

The patterned photoresist can be stripped immediately after the via pattern is transferred into the hardmask layer 112 by utilizing a conventional stripping process. Alternatively, the patterned photoresist can be stripped after the via pattern is transferred into the insulating layer 110 and the dielectric capping layer 108. The etching used in transferring the via pattern may comprise a dry etching process, a wet chemical etching process or a combination thereof. The term "dry etching" is used herein to denote an etching technique such as reactive-ion etching, ion beam etching, plasma etching, or laser ablation.

Figure 2A:
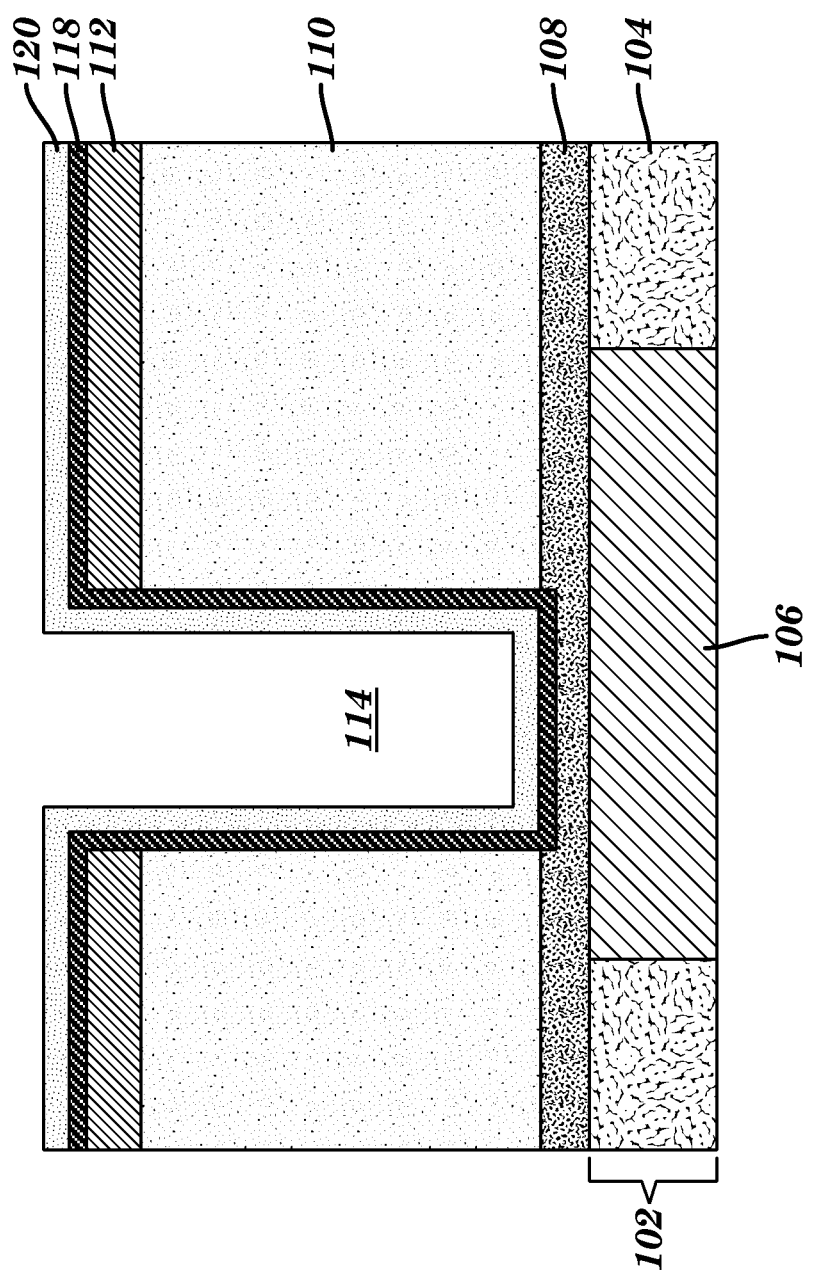
Figure 2B:
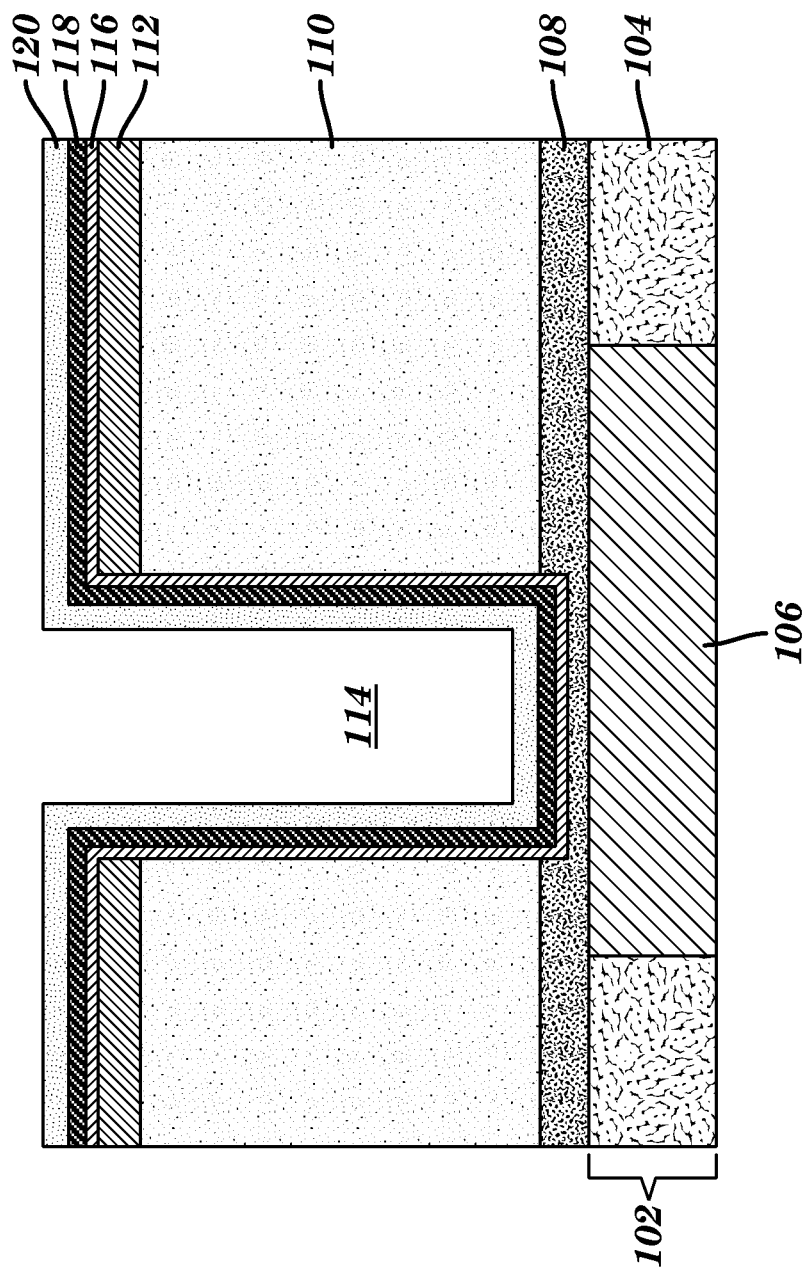

Referring to FIGS. 2A and 2B, a first electrode layer 118 is formed over the sidewalls and the bottom of the via 112 and over the top surface of the hardmask layer 112. Preferably, the first electrode layer 118 is a conductive material. Conductive materials suitable for the first electrode layer 118 include, but are not limited to, Ta, Ru, Co, Pt, W, Rh, Ir, Au, Al, Ti, and an alloy of two or more of the foregoing materials. The first electrode layer 118 may be formed utilizing a conventional deposition process such as, for example, PVD, CVD, PECVD, an atomic layer deposition (ALD) process, or a plasma enhanced atomic layer deposition (PEALD). Typically, the first electrode layer 118 has a thickness from about 1 nm to about 50 nm, with a thickness from about 2 nm to about 20 nm being more typical.

A first high-k dielectric material layer 120 is then formed over the first electrode layer 118. Materials suitable for the first high-k dielectric layer 120 include, but are not limited to, oxide-nitride-oxide, $SiO_2$, $TaO_5$, $PSiN_x$, $Si_3N_4$, SiON, SiC, $TaO_2$, $ZrO_2$, $HfO_2$, $HfSiO_2$, $Al_2O_3$, and any combination of two or more of the foregoing materials. Preferably, the first high-k dielectric material layer 120 has a dielectric constant of about 5 to about 60. More preferably, the first high-k dielectric material layer 120 has a dielectric constant of about 8 to about 40. The dielectric constants mentioned herein are measured in a vacuum. The first high-k dielectric material layer 120 may be formed utilizing a conventional deposition process such as, for example, CVD, PECVD, ALD, or PEALD. Typically, the first high-k dielectric material layer 120 has a thickness from about 1 nm to about 40 nm, with a thickness from about 2 nm to about 10 nm being more typical.

Preferably, a barrier liner layer 116 is formed over the sidewalls and the bottom of the via 112 and over the top surface of the hardmask layer 112 before the first electrode layer 118 is formed (FIG. 2B). The first electrode layer 118 is then formed over the barrier liner layer 116. The barrier liner layer 116 enhances adhesion between insulating layer 110 and the first electrode layer 118. The barrier liner layer 116 also prevents any metallic material within the via from diffusing into the insulating layer 110. The barrier liner layer 116 may be metallic, insulating, or a combination of both. Materials suitable for the barrier liner layer 116 include, but are not limited to, Ta(N), Ti(N), W(N), $SiO_2$, $Si_3N_4$, and SiC. The barrier liner layer 116 may be formed utilizing a conventional deposition process such as, for example, PVD, CVD, PECVD, ALD, or PEALD. Typically, the barrier liner layer 116 has a thickness from about 2 nm to about 30 nm, with a thickness from about 3 nm to about 10 nm being more typical.

Figure 3:
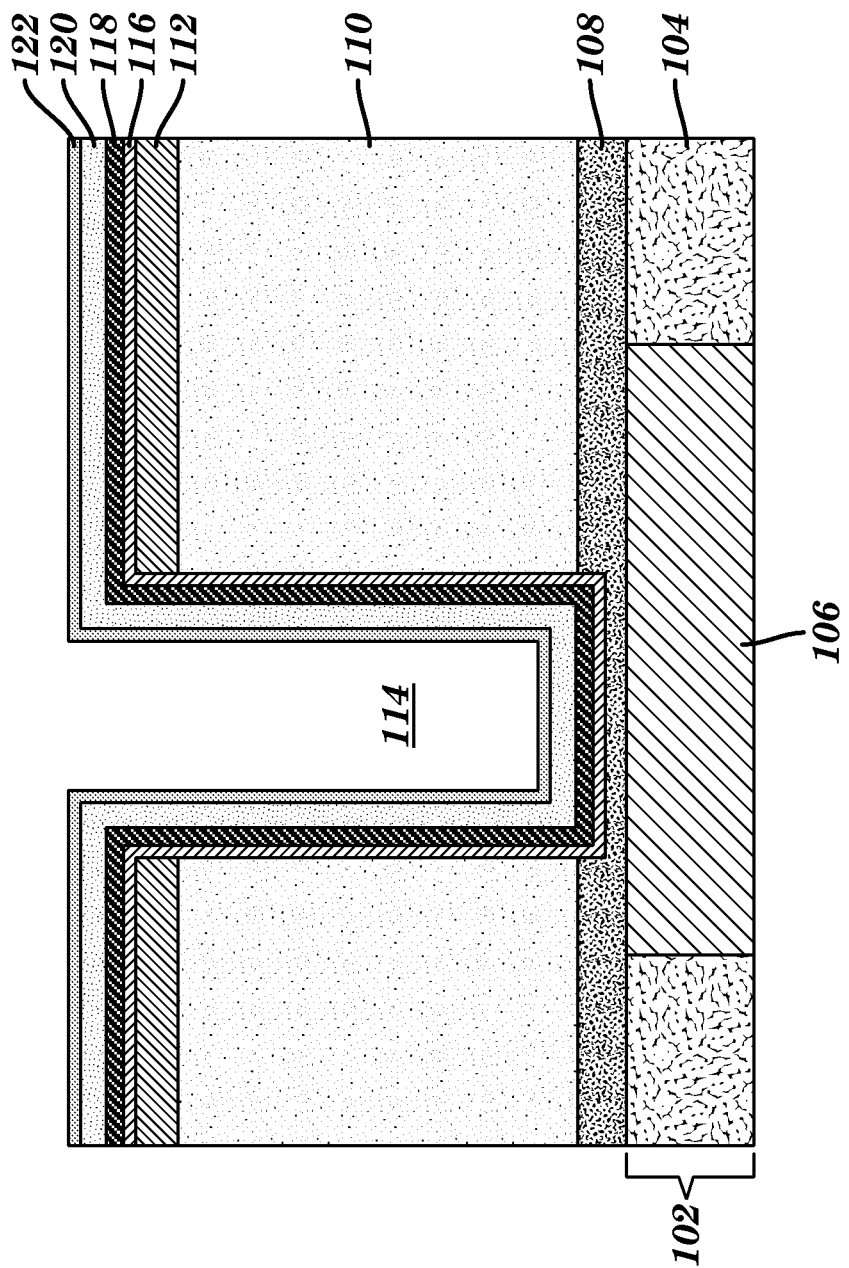

In FIG. 3, a first conductive plate layer 122 is formed over the first high-k dielectric material layer 120. The first conductive plate layer 122 may be formed from materials including Ta, Ru, Co, Pt, W, Rh, Ir, Au, Al, Ti, or an alloy of two or more of the foregoing materials. As shown in FIG. 3, the first conductive plate layer 122 is substantially parallel to the first electrode layer 118. The first conductive plate layer 122 may be formed utilizing a conventional deposition process such as, for example, PVD, CVD, PECVD, ALD, or PEALD. Typically, the first conductive plate layer 122 has a thickness from about 1 nm to about 50 nm, with a thickness from about 2 nm to about 30 nm being more typical.

Figure 4A:
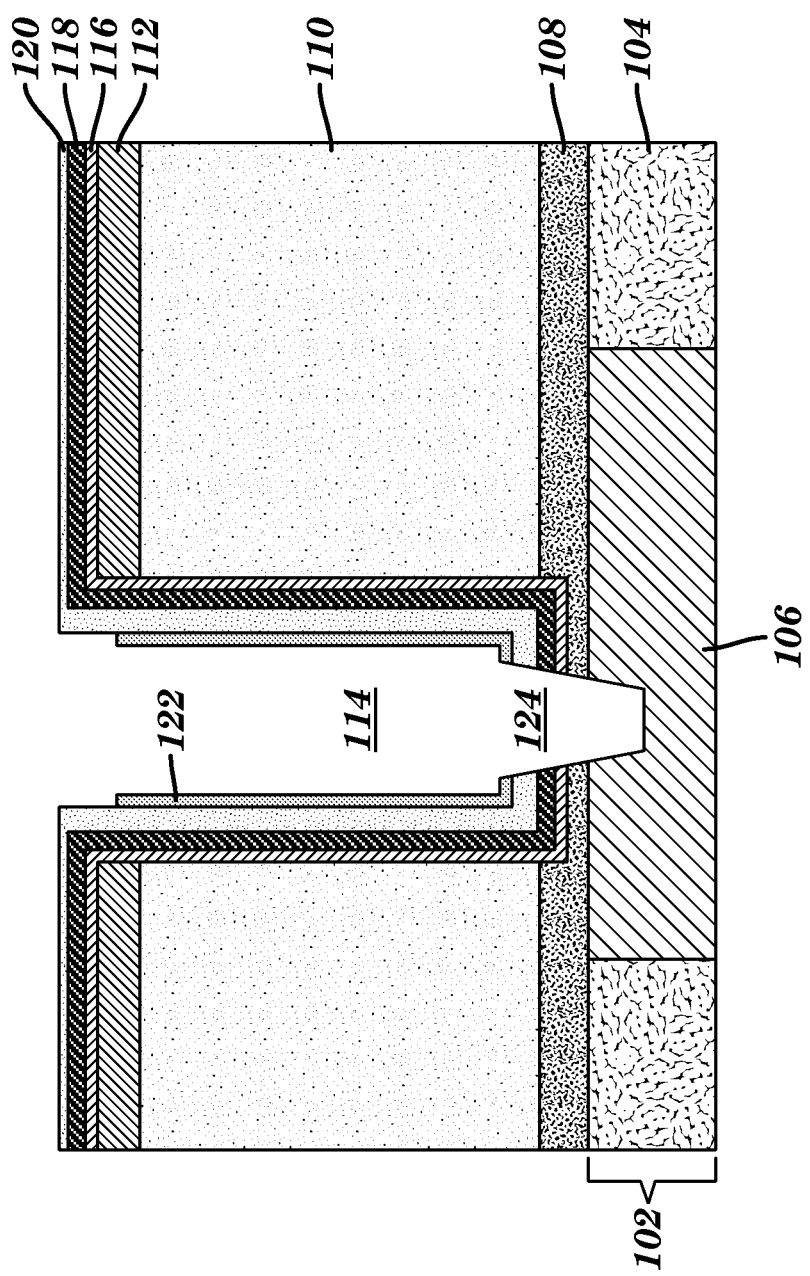
Figure 4B:
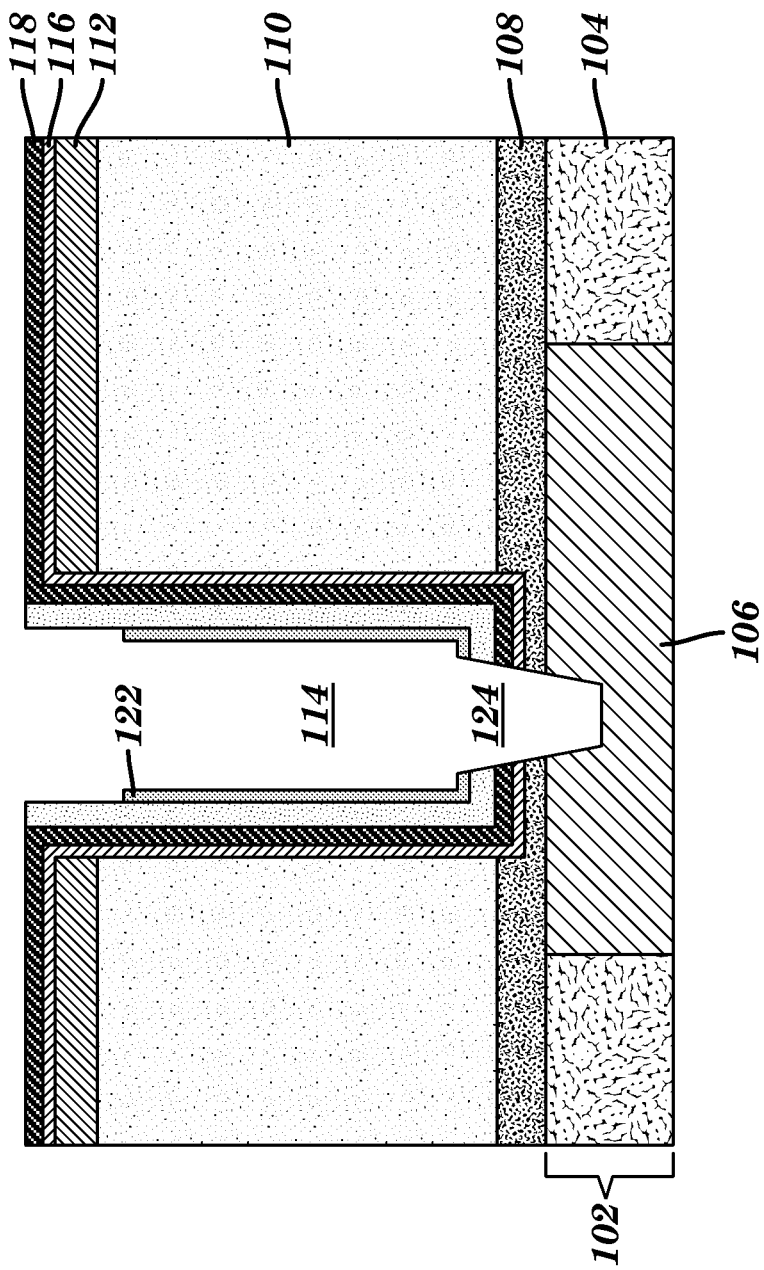

In FIGS. 4A and 4B, a portion of the first conductive plate layer 122, a portion of the first high-k dielectric material layer 120, a portion of the first electrode layer 118, a portion of the first dielectric capping layer 116 and a portion of the first conductive feature 106 is removed to form a via gouging 124 at the bottom of the via 114. The via gouging 124 extends partially through the first conductive feature 106. A directional sputtering process is employed to form the via gouging 124. The directional sputtering process is conducted with a gas source including, but not limited to, Ar, He, Xe, Ne, Kr, Rn, $N_2$, $NH_3$, or $H_2$.

The directional sputtering process used to create the via gouging 124 also removes the first conductive plate layer 122 from the filed area which is outside the via 114 and above the top surface of the hardmask layer 112. In addition, a portion of the first conductive plate layer 122 which is near the top of the via 114 is also removed. As a result, the top end of the first conductive plate layer 122 falls below the top surface of the hardmask layer 112. The height of the first conductive plate layer 122 after the directional process is controlled by the amount of the directional sputtering used to create the gouging feature. In one embodiment, after the directional sputtering process, the top end of the first conductive plate layer 122 is between the top surface and the bottom surface of the hardmask layer 112 (FIG. 4A). In another embodiment, the top end of the first conductive plate layer 122 is below the bottom surface of the hardmask layer 112 (FIG. 4B).

Figure 5:
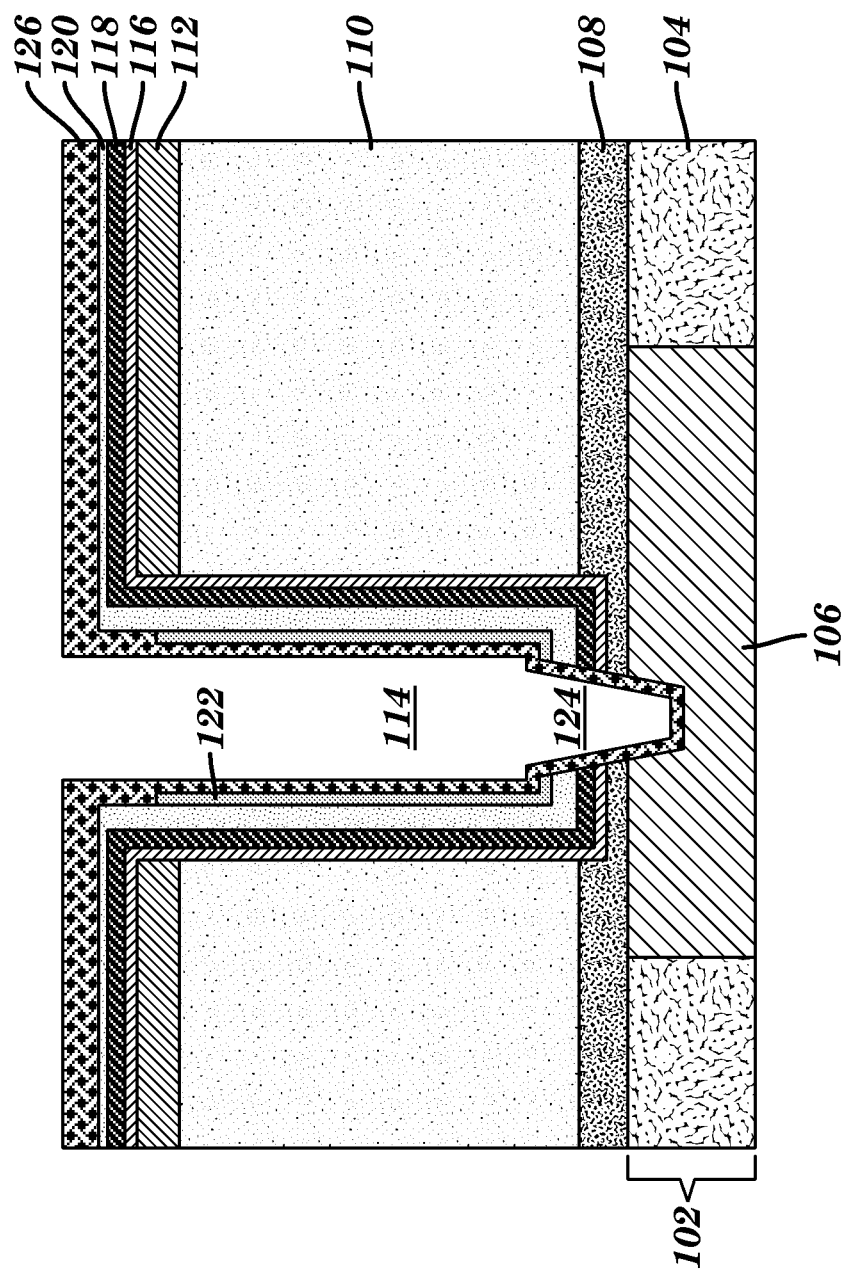

In FIG. 5, a second high-k dielectric material layer 126 is formed over the first conductive plate layer 122 and over the sidewalls and the bottom of the via gouging 124. Materials suitable for the second high-k dielectric layer 126 include, but are not limited to, oxide-nitride-oxide, $SiO_2$, $TaO_5$, $PSiN_x$, $Si_3N_4$, SiON, SiC, $TaO_2$, $ZrO_2$, $HfO_2$, $HfSiO_2$, $Al_2O_3$, and any combination of two or more of the foregoing materials. Preferably, the second high-k dielectric material layer 126 is formed from the same material as the first high-k dielectric material layer 120. Preferably, the second high-k dielectric material layer 126 has a dielectric constant of about 5 to about 60. More preferably, the second high-k dielectric material layer 126 has a dielectric constant of about 8 to about 40. The dielectric constants mentioned herein are measured in a vacuum. The second high-k dielectric material layer 126 may be formed utilizing a conventional deposition process such as, for example, CVD, PECVD, ALD, or PEALD. Typically, the second high-k dielectric material layer 126 has a thickness from about 1 nm to about 40 nm, with a thickness from about 2 nm to about 10 nm being more typical.

Figure 6:
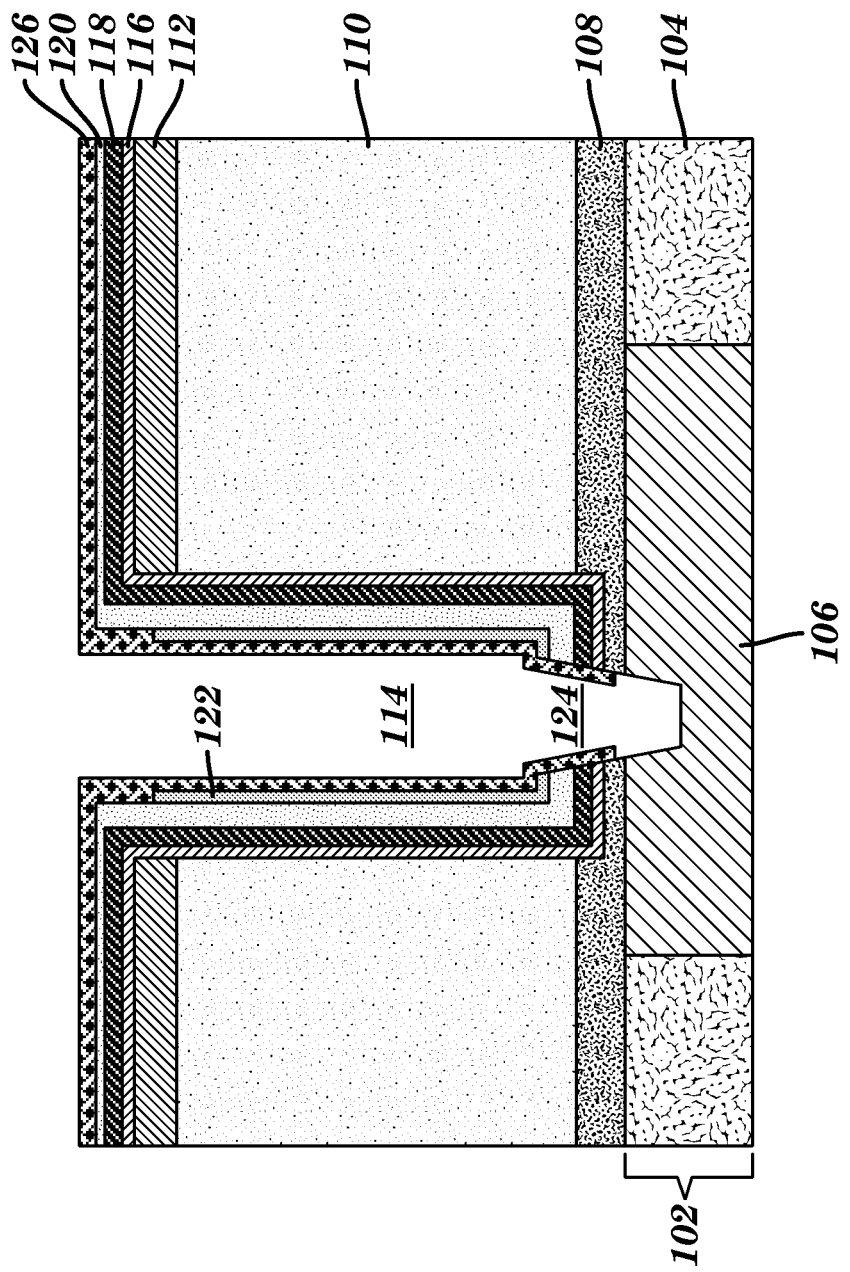

A slight directional etching/sputtering process is used to selectively remove the second high-k dielectric material layer 126 from the bottom and lower sidewalls of the via gouging 124 (FIG. 6). This slight directional sputtering process also removes a small amount of the second high-k dielectric layer 126 from the field area. The main purpose of this process is to make an electrical contact between the capacitor and the underneath interconnect level 102. The slight directional sputtering process is conducted with a gas source including, but not limited to, Ar, He, Xe, Ne, Kr, Rn, $N_2$, $NH_3$, or $H_2$.

Figure 7:
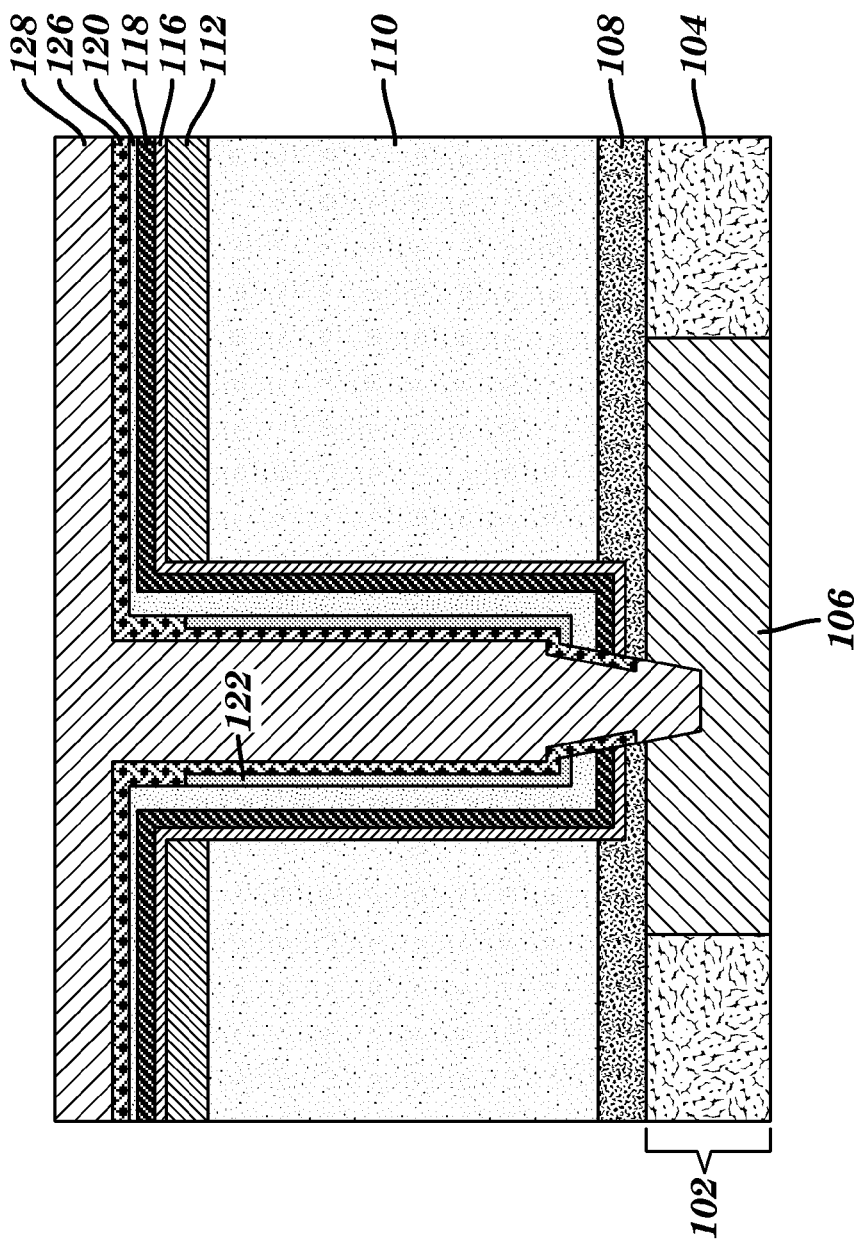

In FIG. 7, the remaining portion of the via 114 and the via gouging 124 are filled with a second electrode 128. Preferably, the second electrode 128 is Cu, Al, W, Ru, Rh, Ir, Co, or an alloy comprising two or more of the foregoing metals. More preferably, the second electrode 128 is Cu or AlCu alloy. The second electrode may be formed by CVD, PECVD, sputtering, chemical solution deposition or plating. As shown, the second electrode 128 is in contact with the first conductive feature 106.

An optional adhesion/plating seed layer (not shown) may be formed before filling the via 114 and the via gouging 124 with the second electrode 128. The optional adhesion/plating seed layer is comprised of a metal or metal alloy from Group VIIIA of the Periodic Table of Elements. Examples of suitable Group VIIIA elements for the adhesion/plating seed layer include, but are not limited to, Ru, TaRu, Ir, Rh, Pt, Pd, Co and alloys thereof. In some embodiments, it is preferred to use Ru, Ir, Co or Rh as the adhesion/plating seed layer.

The adhesion/plating seed layer is formed by a conventional deposition process including, for example, CVD, PECVD, ALD, plating, sputtering and PVD. The thickness of the adhesion/plating seed layer may vary depending on number of factors including, for example, the compositional material of the adhesion/plating seed layer and the technique that was used in forming the same. Typically, the adhesion/plating seed layer has a thickness from about 0.5 nm to about 10 nm, with a thickness of about 0.5 nm to about 6 nm being more typical.

Figure 8:
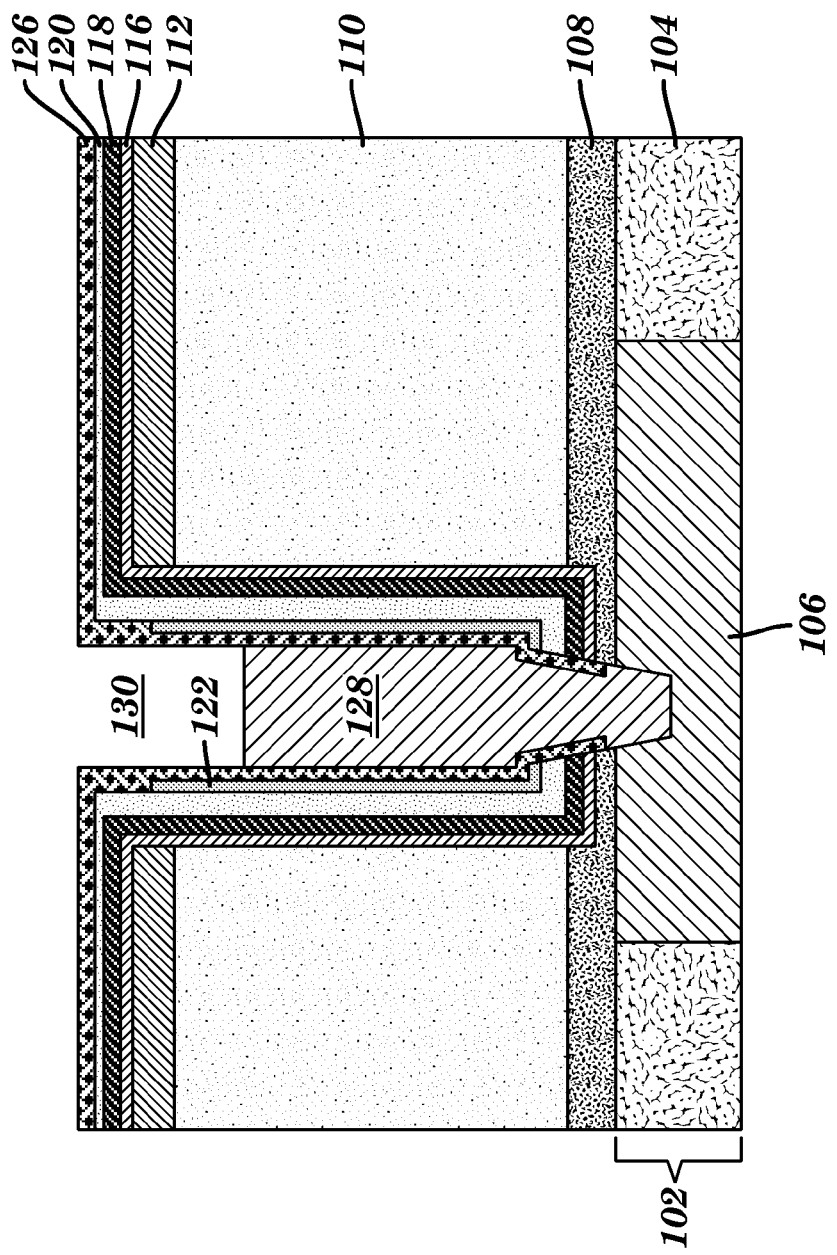

In FIG. 8, the second electrode material 128 in the field area and near the top of the via 114 is removed to form a recess 130. The recess 130 may be formed by first removing the second electrode material outside the via 114 through a chemical mechanical polishing (CMP) process and/or a grinding process. The portion of the second electrode material near the top of the via 114 is then removed by a wet etching process. Preferably, the wet etching process is performed using a chemical comprising HF, HCl, $H_2SO_4$, or any combination of two or more of said foregoing materials.

Figure 9:
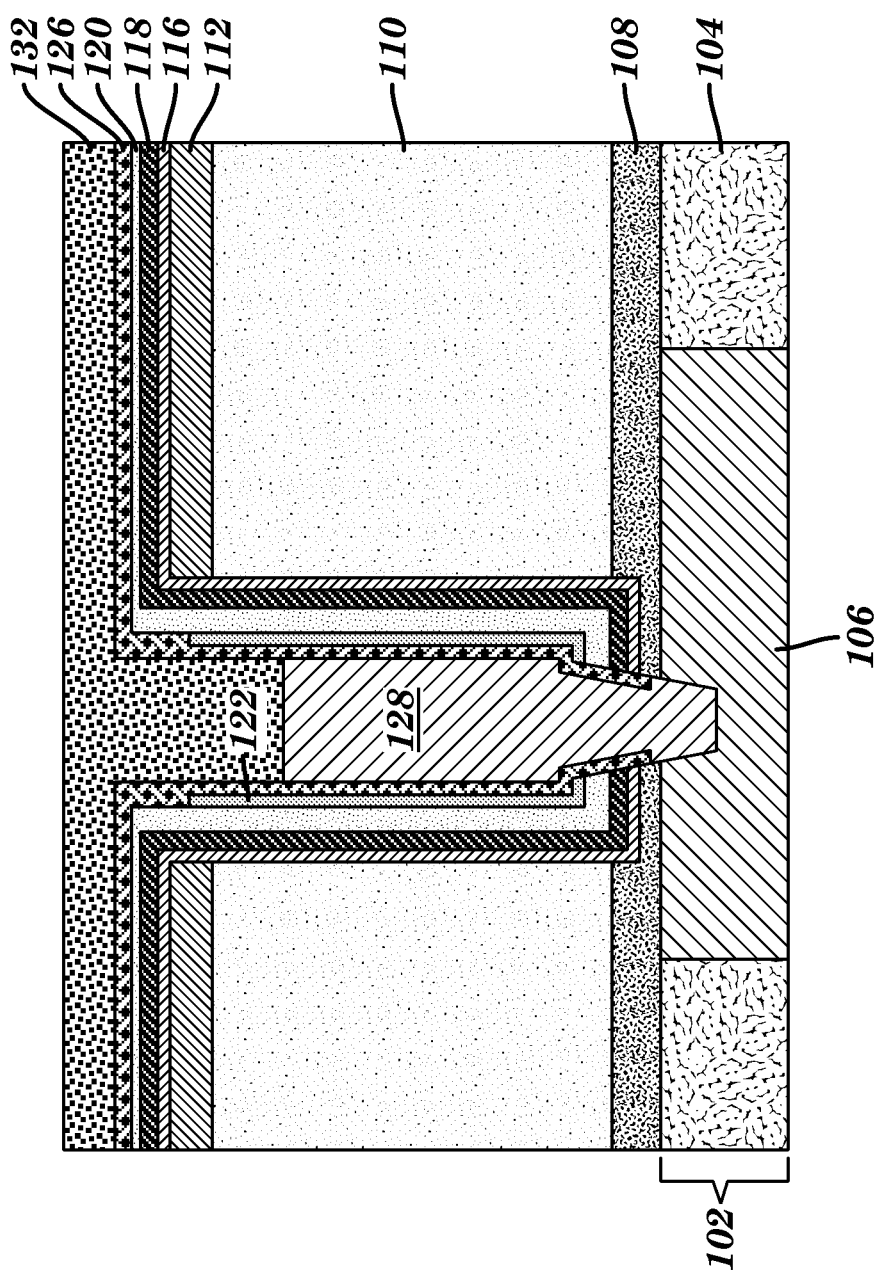

A second dielectric capping layer 132 is formed to fill the recess 130 (FIG. 9). Like the dielectric capping layer 108, the second dielectric capping layer 132 can be formed by a conventional deposition process such as, for example, CVD, PECVD, chemical solution deposition, or evaporation. The second dielectric capping layer 132 may be any suitable dielectric capping material including, but not limited to, SiC, Si4NH3, SiO2, a carbon doped oxide, a nitrogen and hydrogen doped silicon carbide (SiC(N,H)), or multilayers thereof.

Figure 10A:
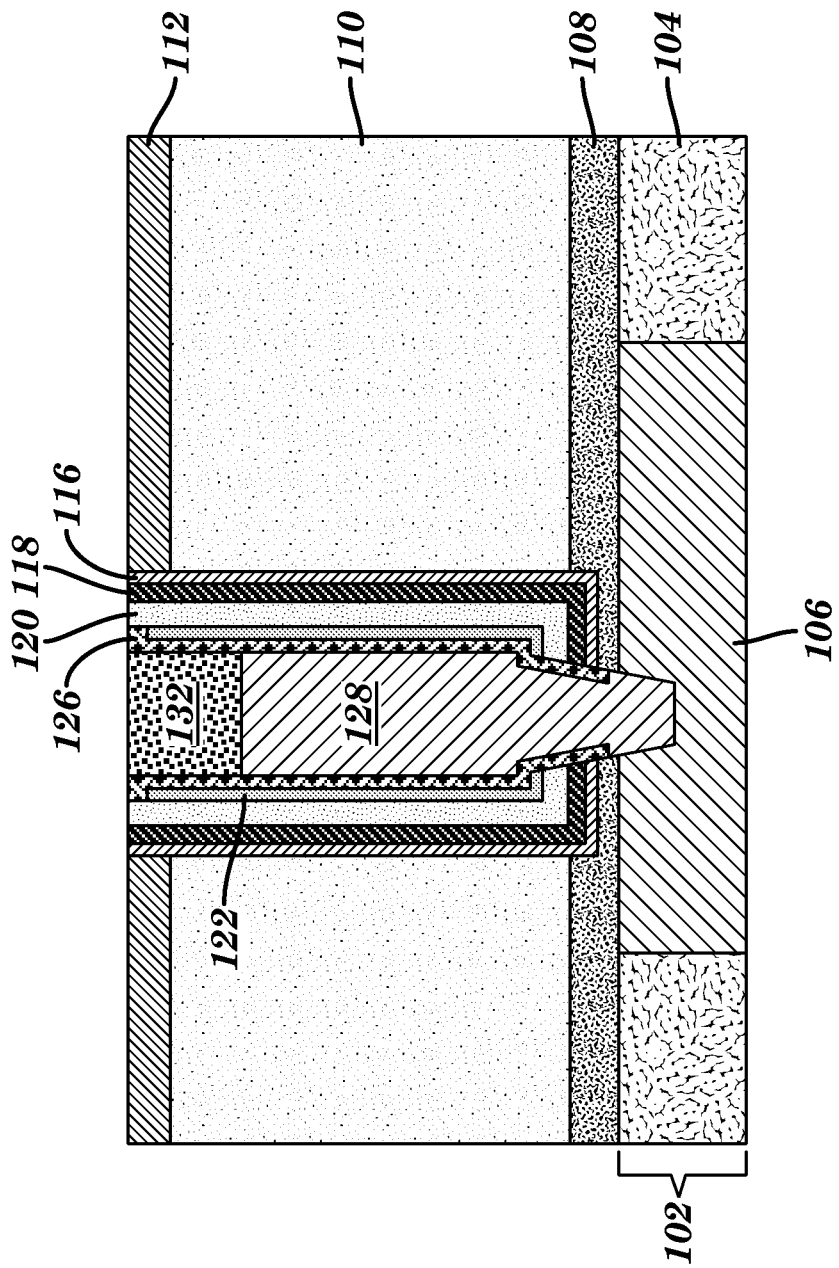
Figure 10B:
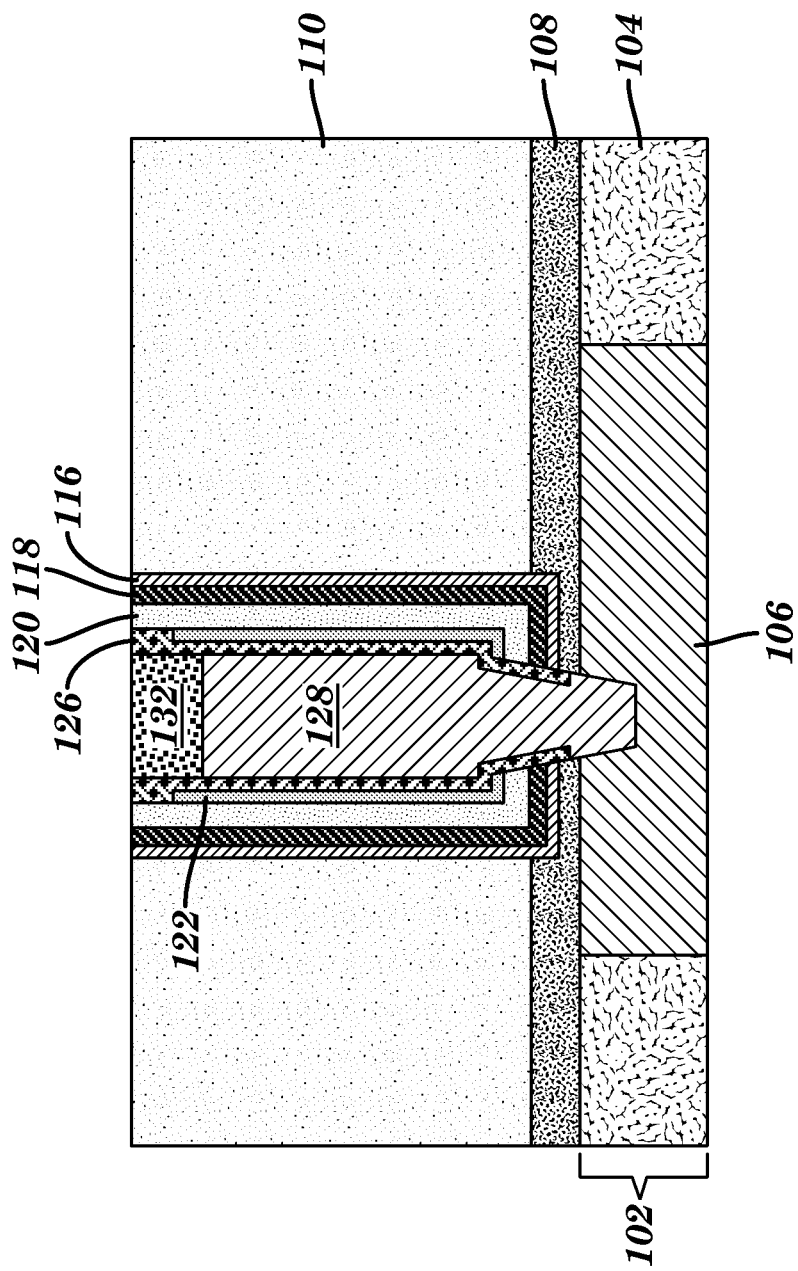

Next, the structure shown in FIG. 9 is subjected to a polishing process to remove various layers remaining in the field area. In one embodiment, the polishing process stops on the hardmask layer 112 (FIG. 10A). In another embodiment, when the top end of the first conductive plate layer 122 is below the bottom surface of the hardmask layer 112, the polishing process stops until the entire hardmask layer 112 is removed (FIG. 10B).

Figure 11:
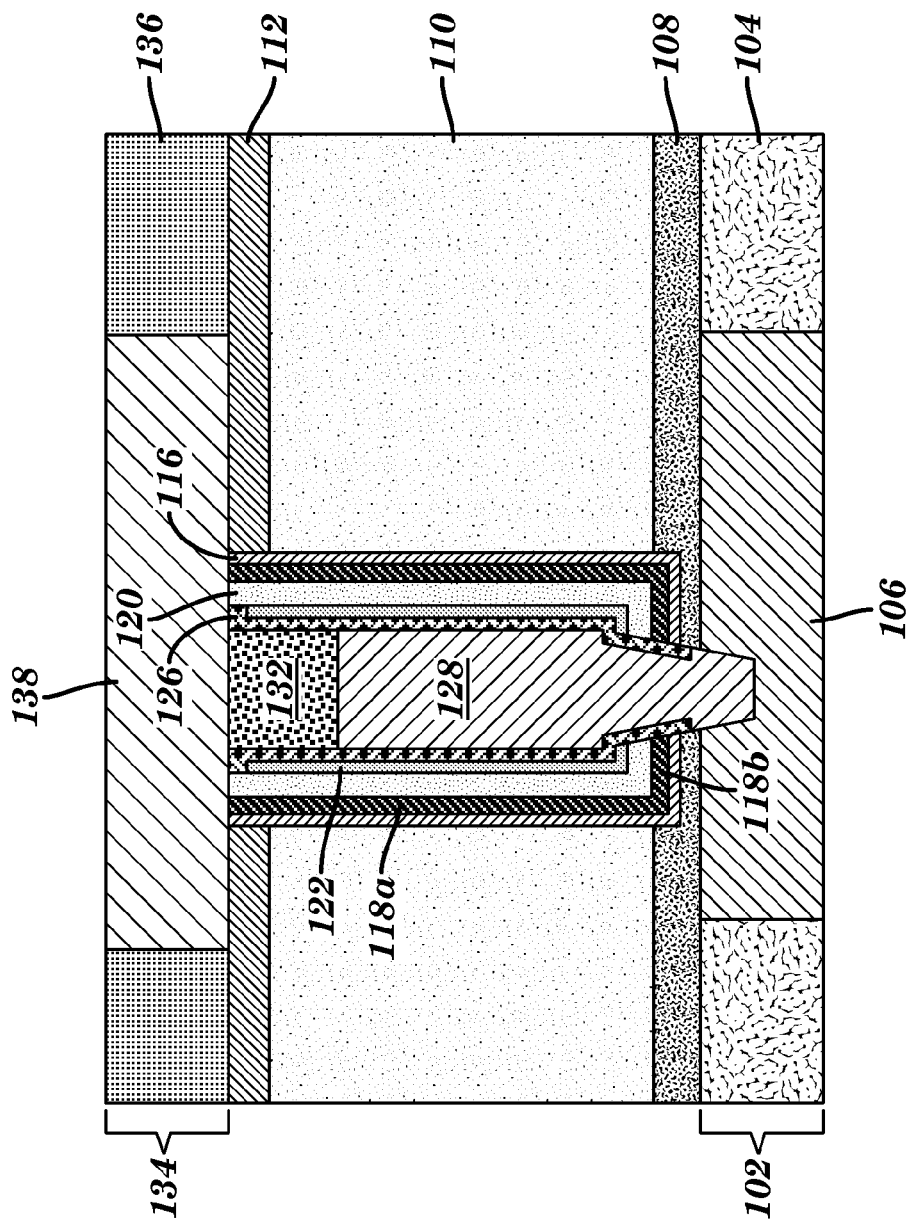

In FIG. 11, an upper level interconnect level 134 is formed over the insulating layer 110. The upper level interconnect level 134 has a second dielectric layer 136 with a second conductive feature 138 embedded in the second dielectric layer 136.

The second dielectric layer 136 may be any interlevel or intralevel dielectrics including inorganic dielectrics or organic dielectrics. The second dielectric layer 136 may be porous or non-porous. Examples of suitable dielectrics that can be used as second dielectric layer 136 include, but are not limited to, $SiO_2$, silsesquioxanes, C doped oxides (i.e., organosilicates) that include atoms of Si, C, O and H, thermosetting polyarylene ethers, or multilayers thereof.

Preferably, the second dielectric layer 136 has a dielectric constant of about 4.0 or less. More preferably, the second dielectric layer 136 has a dielectric constant of about 2.8 or less. The dielectric constants mentioned herein are measured in a vacuum.

The thickness of the second dielectric layer 136 may vary depending on the dielectric material used as well as the exact number of dielectric layers within the upper interconnect level 134. Typically, and for normal interconnect structures, the second dielectric layer 136 has a thickness from about 200 nm to about 450 nm.

The second conductive feature 138 may be formed by lithography, similar to the conductive feature 106. The second conductive feature 138 may be formed from materials including, but are not limited to, polysilicon, a conductive metal, an alloy of two or more conductive metals, a conductive metal silicide and a combination of two or more of the foregoing materials. Preferably, the second conductive feature 138 is a conductive metal such as Cu, W, Al, or alloys of the foregoing metals. More preferably, the second conductive feature 138 is Cu or a Cu alloy (such as AlCu). A conventional planarization process such as, for example, CMP, can be used to provide a structure in which the second conductive feature 138 has an upper surface that is substantially coplanar with the upper surface of the second dielectric layer 136.

The second conductive feature 138 is preferably separated from the second dielectric layer 136 by a diffusion barrier layer (not shown). The diffusion barrier layer may include, but is not limited to, Ta, TaN, Ti, TiN, Ru, RuTaN, RuTa, W, WN or any other material that can serve as a barrier to prevent a conductive material from diffusing into a dielectric material layer. The diffusion barrier layer may be formed by a deposition process such as, for example, atomic layer deposition (ALD), CVD, PECVD, physical vapor deposition (PVD), sputtering, chemical solution deposition, or plating. The diffusion barrier layer may also include a bilayer structure that includes a lower layer of a metallic nitride such as, for example, TaN and an upper metallic layer such as, for example, Ta.

As shown in FIG. 11, at this stage, the first electrode layer 118 has a first portion 118a which is substantially perpendicular to the lower interconnect level 102 and the underlying substrate (not shown). The first electrode layer 118 also has a second portion 118b which is substantially parallel to the lower interconnect level 102 and the underlying substrate. Preferably, the ratio of the height of the first portion 118a to the length of the second portion 118b is greater than 2. More preferably, the ratio of the height of the first portion 118a to the length of the second portion 118b is greater than 4. The first conductive plate 122 is surrounded by the first high-k dielectric material layer 120 and the second high-k dielectric material layer 126. The first conductive plate 122 is not in contact with the first electrode layer 118 and the second electrode 128.

Note that it is possible to coat a second conductive plate layer and a third high-k dielectric material layer over the second high-k dielectric material layer 126 before forming the second electrode 128. This will lead to the formation of a capacitor with two floating conductive plates between the two electrodes. The second conductive plate and the third high-k dielectric material layer are between the second high-k dielectric material layer 126 and the second electrode 128. The second conductive plate is substantially parallel to the first electrode layer 118 and is not in contact with the first and second electrodes 118 and 128 and the first conductive plate 122. The second conductive plate layer may be formed by the materials and the techniques used to form the first conductive plate layer 122, as described above. Similarly, the third high-k dielectric material layer may be formed by the materials and the techniques used to form the first and second high-k dielectric material layers 120 and 126, as described above.

Figure 12:
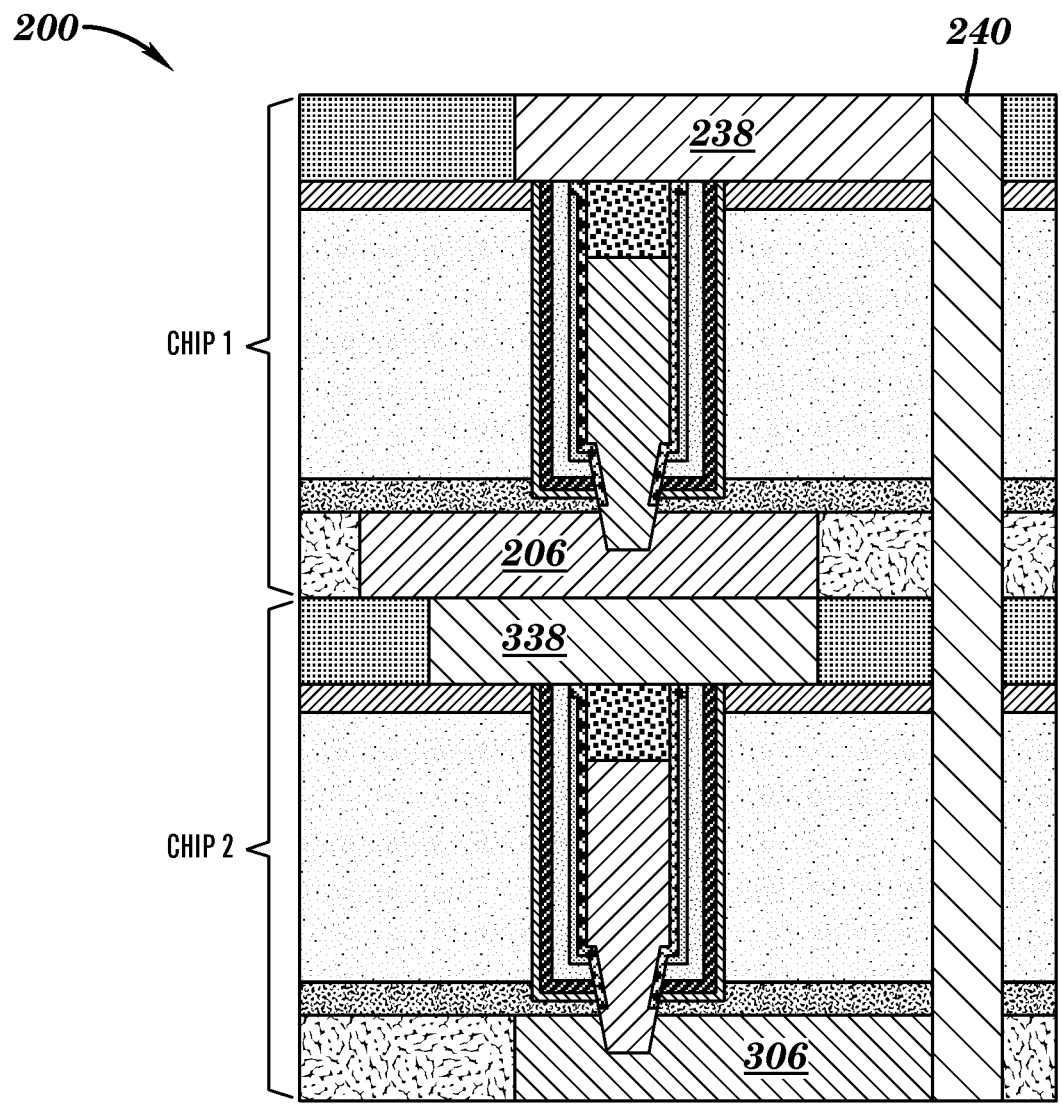
FIG. 12 is a cross-sectional view of an array of two 3D via capacitor with a floating conductive plate, in accordance with an embodiment of the present invention.

To further improve the reliability the capacitor structure shown in FIG. 11, an array of such capacitors is formed. The array of capacitors 200 as shown in FIG. 12 is formed by bonding two chips (Chips 1 and 2) together. Chip 1 contains a first capacitor. Chip 2 contains a second capacitor. The first and second capacitors have substantially the same structure. Chip 1 is bonded atop Chip 2 in a way such that the first conductive feature 206 of the first capacitor on Chip 1 is in contact with the second conductive feature 338 of the second capacitor on Chip 2. A conductor 240 is then formed to connect the first conductive feature 306 of the second capacitor on Chip 2 and the second conductive feature 238 of the first capacitor on Chip 1. The conductor 240 may be a conductive metal, an alloy of two or more conductive metals, a conductive metal silicide and a combination of two or more of the foregoing materials. Preferably, the conductor 240 is a conductive metal such as Cu, W, Al, or alloys of the foregoing metals. More preferably, the conductor 240 is Cu or a Cu alloy (such as AlCu).

Figure 13:
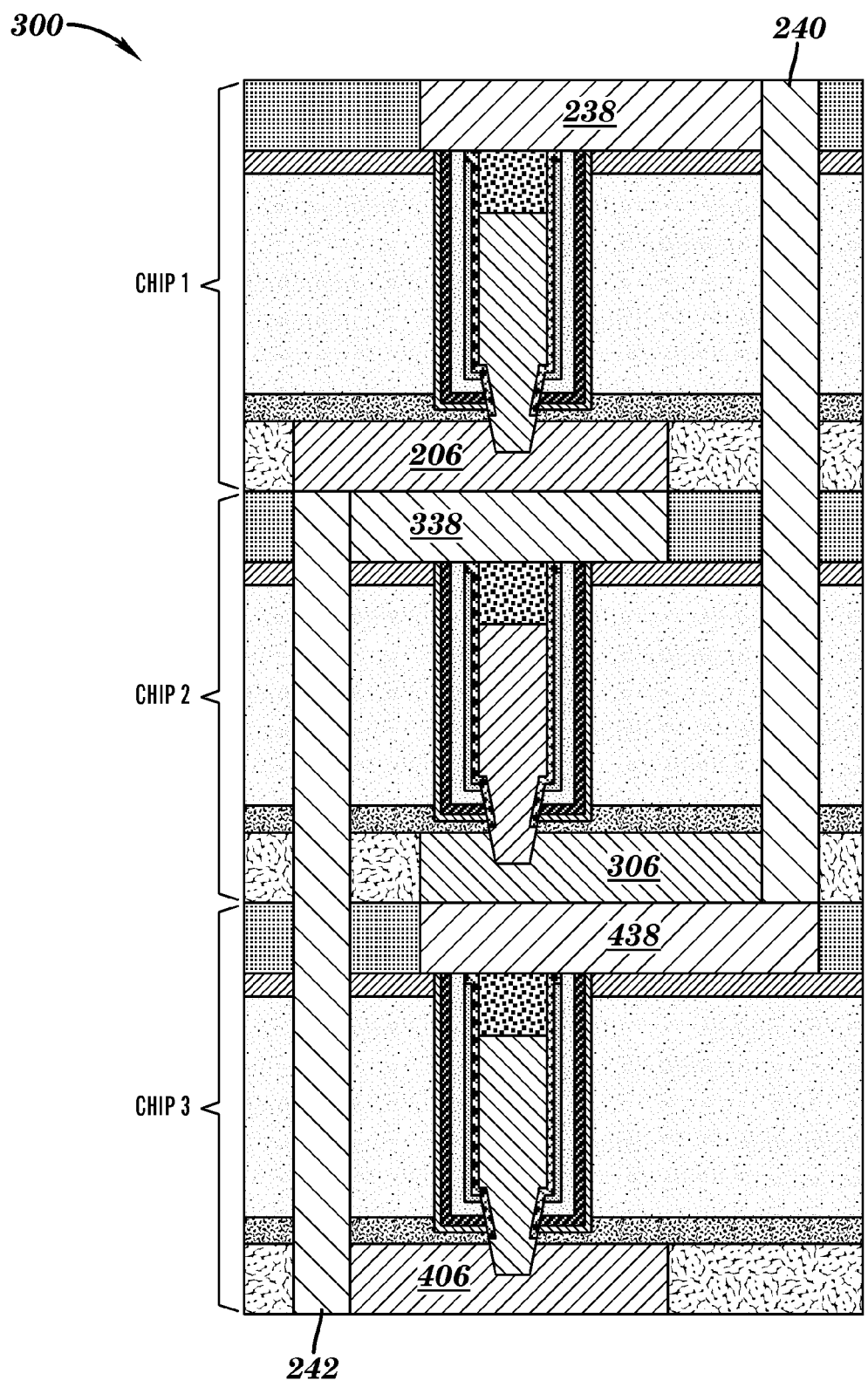
FIG. 13 is a cross-sectional view of an array of three 3D via capacitor with a floating conductive plate, in accordance with an embodiment of the present invention.

In FIG. 13, a third chip (Chip 3) is bonded to the structure shown on FIG. 12 to form an array of three capacitors 300. Chip 3 has a third capacitor which has substantially the same structure as the first and second capacitors on Chips 1 and 2 respectively. Chip 3 is bonded to the array of Chips 1 and 2 in a way such that the second conductive feature 438 of the third capacitor on Chip 3 is in contact with the first conductive feature 306 of the second capacitor on Chip 2. A second conductor 242 is then formed to connect the first conductive feature 406 of the third capacitor on Chip 3 and the second conductive feature 338 of the second capacitor on Chip 2. Similarly, the conductor 242 may be a conductive metal, an alloy of two or more conductive metals, a conductive metal silicide and a combination of two or more of the foregoing materials. Preferably, the conductor 242 is a conductive metal such as Cu, W, Al, or alloys of the foregoing metals. More preferably, the conductor 242 is Cu or a Cu alloy (such as AlCu).

While the present invention has been particularly shown and described with respect to preferred embodiments, it will be understood by those skilled in the art that the foregoing and other changes in forms and details may be made without departing from the spirit and scope of the invention. It is therefore intended that the present invention not be limited to the exact forms and details described and illustrated but fall within the scope of the appended claims.

What is claimed is:

1. A capacitor, comprising:
    an insulating layer on a substrate, said insulating layer including a via having sidewalls and a bottom;
    a first electrode overlying said sidewalls and at least a portion of said bottom of said via;
    a first high-k dielectric material layer overlying said first electrode;
    a first conductive plate over said first high-k dielectric material layer;
    a second high-k dielectric material layer formed to overlie the first conductive plate and to leave a remaining portion of said via unfilled;
    a second electrode formed in said remaining portion of said via, wherein said first conductive plate is substantially parallel to said first electrode and is not in contact with said first and second electrodes;
    a lower interconnect level between said substrate and said insulating layer, said lower interconnect level including a first dielectric layer having a first conductive feature embedded therein; and
    an upper interconnect level above said insulating layer, said upper interconnect level including a second dielectric layer having a second conductive feature embedded therein, wherein said first electrode is in contact with said second conductive feature and said second electrode is in contact with said first conductive feature,
    wherein said second high-k material layer has i) a portion substantially parallel with said substrate, ii) a portion substantially perpendicular with said substrate, and iii) a portion neither substantially perpendicular and neither substantially parallel with said substrate.

2. The capacitor of claim 1, further comprising a second conductive plate and a third high-k dielectric material layer between said second high-k dielectric material layer and said second electrode, wherein said second conductive plate is substantially parallel to said first electrode and is not in contact with said first and second electrodes and said first conductive plate.

3. The capacitor of claim 1, wherein said via has a via gouging extending partially through said first conductive feature and said via gouging is filled with said second electrode material.

4. The capacitor of claim 1, further comprising a first dielectric capping layer located between said lower interconnect level and said insulating layer.

5. The capacitor of claim 1, further comprising a second dielectric capping layer located between said upper interconnect level and said second electrode.

6. The capacitor of claim 1, further comprising a hardmask layer located between said upper interconnect level and said insulating layer.

7. The capacitor of claim 1, further comprising a barrier liner layer located between said first electrode and said insulating layer.

8. The capacitor of claim 1, wherein said first electrode has a first portion substantially perpendicular to said substrate and a second portion substantially parallel to said substrate.

9. The capacitor of claim 8, wherein the ratio of the height of said first portion to the length of said second portion is greater than 2.

10. The capacitor of claim 1, wherein said first electrode comprises Ta, Ru, Co, Pt, W, Rh, Ir, Au, Al, Ti, or an alloy of two or more of the foregoing materials.

11. The capacitor of claim 1, wherein said first and second high-k dielectric material layers are formed from a same dielectric material, said dielectric material comprises oxide-nitride-oxide, SiO2, TaO5, PSiNx, Si3N4, SiON, SiC, TaO2, ZrO2, HfO2, HfSiO2, Al2O3, or any combination of two or more of the foregoing materials.

12. The capacitor of claim 11, wherein said dielectric material has a dielectric constant in the range from about 5 to about 60.

13. The capacitor of claim 1, wherein said second electrode comprises Cu, Al, W, Ru, Rh, Ir, Co, or an alloy comprising two or more of the foregoing metals.

14. The capacitor of claim 1, wherein said first conductive plate comprises Ta, Ru, Co, Pt, W, Rh, Ir, Au, Al, Ti, or an alloy of two or more of the foregoing materials.

* * * * *